(12) United States Patent
Naka et al.

(10) Patent No.: US 10,103,302 B2
(45) Date of Patent: Oct. 16, 2018

(54) LIGHT EMITTING DEVICE

(71) Applicant: NICHIA CORPORATION, Anan-shi (JP)

(72) Inventors: Ryoji Naka, Tokushima (JP); Naofumi Sumitani, Itano-gun (JP); Yasuo Kato, Anan (JP); Tomohide Miki, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 183 days.

(21) Appl. No.: 14/757,843

(22) Filed: Dec. 24, 2015

(65) Prior Publication Data

US 2016/0204321 A1 Jul. 14, 2016

(30) Foreign Application Priority Data

Dec. 25, 2014 (JP) .................................. 2014-263699
Sep. 30, 2015 (JP) .................................. 2015-195082

(51) Int. Cl.
*H01L 33/62* (2010.01)
*H01L 33/44* (2010.01)
(Continued)

(52) U.S. Cl.
CPC .............. *H01L 33/62* (2013.01); *H01L 33/44* (2013.01); *H01L 33/54* (2013.01); *H01L 33/60* (2013.01); *H01L 25/167* (2013.01); *H01L 33/56* (2013.01); *H01L 2224/45144* (2013.01); *H01L 2224/48091* (2013.01); *H01L 2224/48247* (2013.01);
(Continued)

(58) Field of Classification Search
CPC ......... H01L 33/44; H01L 33/54; H01L 33/56; H01L 33/60; H01L 33/62; H01L 25/167; H01L 51/5256; C08G 77/12; C25D 3/46
See application file for complete search history.

(56) References Cited

U.S. PATENT DOCUMENTS

2006/0001040 A1* 1/2006 Kim ..................... H01L 51/5256
257/100
2006/0147746 A1* 7/2006 Wakako .................. H01L 33/60
428/627

(Continued)

FOREIGN PATENT DOCUMENTS

JP 2010-199166 9/2010
JP 2012-019062 1/2012
(Continued)

*Primary Examiner* — A. Sefer
(74) *Attorney, Agent, or Firm* — Mori & Ward, LLP

(57) ABSTRACT

A light emitting device includes a base having a first lead electrode and a second lead electrode. Each of the first lead electrode and the second lead electrode includes a reflecting layer which includes silver or silver alloy plating containing a sulfur-based gloss agent. A light emitting element is provided on one side of the base and is electrically connected to the first lead electrode and the second lead electrode. The reflecting layer is on the one side of the base. A sealer includes resin and is provided on the one side of the base to seal the light emitting element and at least a part of the first lead electrode and the second lead electrode. A light-transmissive protective film includes an inorganic matter and is provided between the reflecting layer and the sealer.

21 Claims, 3 Drawing Sheets

(51) Int. Cl.
  *H01L 33/54* (2010.01)
  *H01L 33/60* (2010.01)
  *H01L 25/16* (2006.01)
  *H01L 33/56* (2010.01)

(52) U.S. Cl.
  CPC .............. *H01L 2224/48257* (2013.01); *H01L 2224/49113* (2013.01); *H01L 2224/8592* (2013.01); *H01L 2924/0002* (2013.01); *H01L 2924/181* (2013.01)

(56) References Cited

U.S. PATENT DOCUMENTS

| | | | | |
|---|---|---|---|---|
| 2008/0083973 | A1* | 4/2008 | Yamada | H01L 33/60 257/676 |
| 2009/0309115 | A1* | 12/2009 | Hoshino | H01L 33/508 257/98 |
| 2010/0133571 | A1* | 6/2010 | Kawasaki | H01L 25/167 257/98 |
| 2010/0193816 | A1* | 8/2010 | Liu | H01L 33/486 257/98 |
| 2012/0007119 | A1* | 1/2012 | Shiobara | H01L 33/44 257/98 |
| 2012/0132931 | A1* | 5/2012 | Inoue | H01L 33/486 257/88 |
| 2012/0146077 | A1* | 6/2012 | Nakatsu | H01L 33/486 257/98 |
| 2013/0062649 | A1* | 3/2013 | Hata | H01L 33/501 257/98 |
| 2013/0181236 | A1* | 7/2013 | Tamaki | H01L 33/56 257/88 |
| 2013/0187188 | A1* | 7/2013 | Sasaoka | H05K 1/0313 257/99 |
| 2013/0241088 | A1* | 9/2013 | Onai | C08G 77/12 257/791 |
| 2014/0312364 | A1* | 10/2014 | Wakaki | H01L 33/44 257/88 |
| 2015/0023026 | A1 | 1/2015 | Sakamoto et al. | |
| 2015/0270450 | A1* | 9/2015 | Kuroki | H01L 33/507 257/98 |

FOREIGN PATENT DOCUMENTS

| | | |
|---|---|---|
| JP | 2014-179492 | 9/2014 |
| JP | 2015-023081 | 2/2015 |

\* cited by examiner

LIGHT EMITTING DEVICE

CROSS-REFERENCE TO RELATED APPLICATIONS

The present application claims priority under 35 U. S. C. § 119 to Japanese Patent Application No. 2014-263699, filed Dec. 25, 2014 and Japanese Patent Application No. 2015-195082, filed Sep. 30, 2015. The contents of these applications are incorporated herein by reference in their entirety.

BACKGROUND

Technical Field

The present disclosure relates to a light emitting device.

Discussion of the Background

Selenium-based gloss agents have been generally used for silver plating of lead frames for photosemiconductor devices, as described, for example, in Japanese Unexamined Patent Application Publication No. 2010-199166. See, for another example, Japanese Unexamined Patent Application Publication No. 2014-179492.

SUMMARY OF THE INVENTION

According to one aspect of the present invention, a light emitting device includes a base, a light emitting element, a sealer, and a light-transmissive protective film. The base has a first lead electrode and a second lead electrode. Each of the first lead electrode and the second lead electrode includes a reflecting layer including silver or silver alloy plating containing a sulfur-based gloss agent. The light emitting element is provided on one side of the base and is electrically connected to the first lead electrode and the second lead electrode. The reflecting layer is on the one side of the base. The sealer includes resin and is provided on the one side of the base to seal the light emitting element and at least a part of the first lead electrode and the second lead electrode. The light-transmissive protective film includes an inorganic matter and is provided between the reflecting layer and the sealer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
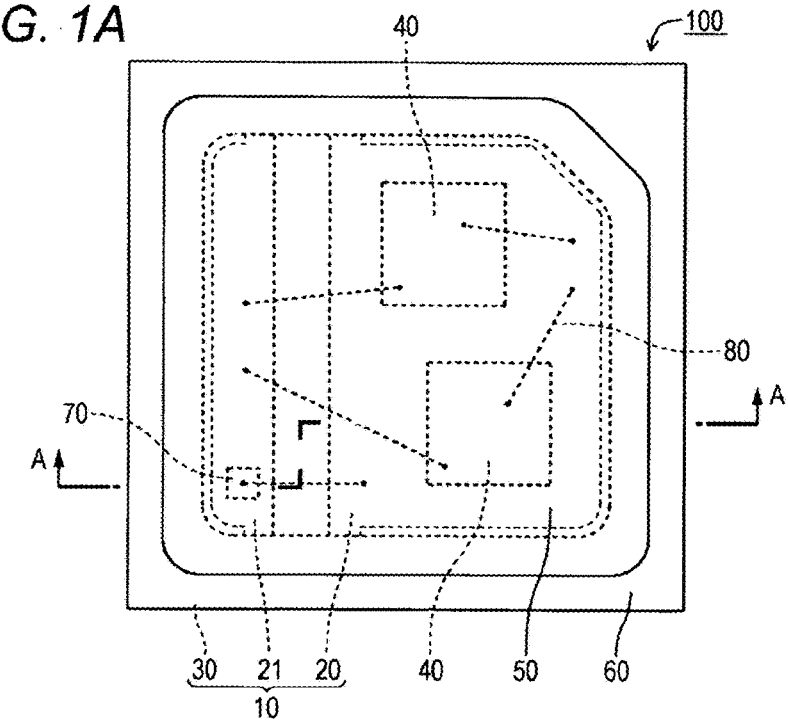
FIG. 1A is a schematic top view of a light emitting device according to an embodiment of the present invention.

The embodiments will now be described with reference to the accompanying drawings, wherein like reference numerals designate corresponding or identical elements throughout the various drawings.

Hereinafter, embodiments of the present invention will be described with reference to the drawings as appropriate. However, below-described light emitting devices are just for embodying the technical idea of the present invention, and the present invention is not limited to them unless otherwise specifically mentioned. The contents described in one embodiment or one example can be applied also to other embodiment and example. In addition, sizes, positional relationships and the like of the constituent members that are illustrated in the respective drawings may be exaggerated for the clearer explanation.

First Embodiment

Figure 1B:
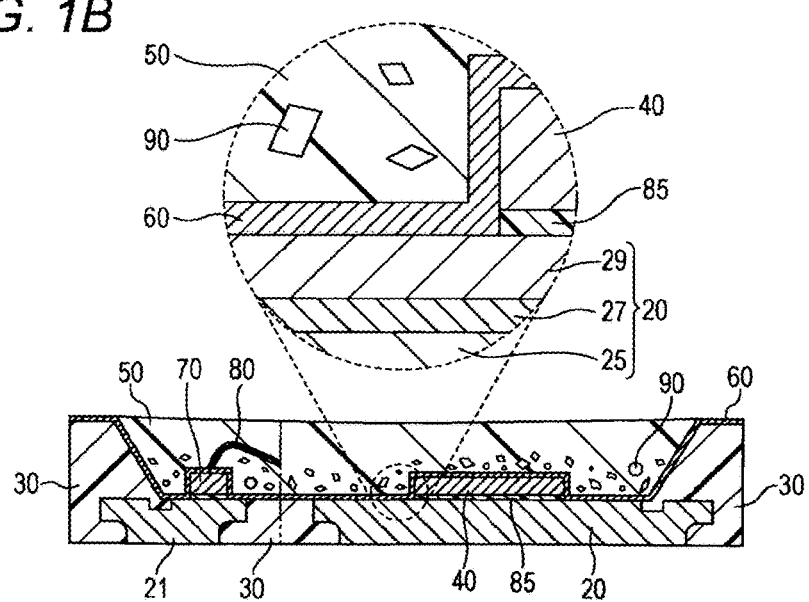
FIG. 1B is a schematic cross-sectional view that illustrates a cross section taken along a line A-A in FIG. 1A.

FIG. 1A is a schematic top view of a light emitting device according to a first embodiment. FIG. 1B is a schematic cross-sectional view that illustrates a cross section taken along a line A-A in FIG. 1A.

As shown in FIGS. 1A and 1B, the light emitting device 100 according to the first embodiment is provided with: a base member (a base) 10; light emitting elements 40; and a sealing member (sealer) 50. The base member 10 has a pair of lead electrodes (a first lead electrode and a second lead electrode) 20 and 21. The light emitting elements 40 are provided on the base member 10, and are connected electrically with the pair of the lead electrodes 20 and 21. The sealing member 50 includes resin as its base material, and is provided on the base member 10 so as to seal the light emitting elements 40 and at least a part of the pair of the lead electrodes 20 and 21.

In more detail, the base member 10 is a package for a light emitting diode (LED). The base member 10 is provided with: the first lead electrode 20; the second lead electrode 21; and a resin molded body 30. The resin molded body 30 is molded integrally with the first lead electrode 20 and the second lead electrode 21. The resin molded body 30 is a cured product or a solidified product of white resin. The base member 10 has a recess portion, and a part of a bottom surface of the recess portion is constituted by an upper surface of the first lead electrode 20 and an upper surface of the second lead electrode 21. The two light emitting elements 40 are stored in the recess portion of the base member 10. Each of the two light emitting elements 40 is an LED chip, which adheres to the bottom surface of the recess portion of the base member 10 with an adhesive 85, and is connected to the lead electrodes 20 and 21 via wires 80. The sealing member 50 is filled in the recess portion of the base member 10. The sealing member 50 contains a phosphor 90.

Then, the pair of the lead electrodes 20 and 21 have, as their surface layers, reflecting layers 29 of silver or silver alloy plating which use (contain) a sulfur-based gloss agent.

Further, between the reflecting layer 29 and the sealing member 50, a light-transmissive protective film 60 of an inorganic matter is formed.

According to the light emitting device 100 having the above-described configuration, high initial reflectivity of the reflecting layer 29 can be obtained, and its deterioration with time can be suppressed, whereby good light emitting efficiency can be obtained.

If producing the reflecting layer 29 of silver plating (hereinafter, silver alloy plating is also included therein) by using the sulfur-based gloss agent, a surface of the reflecting layer 29 can be formed more smoothly and higher glossiness and reflectance can be obtained than those in the case of using a selenium-based gloss agent. At this time, sulfur and/or a sulfur compound in the gloss agent are scattered in crystal grains and/or on a crystal grain boundary of the silver (a content of the sulfur may be, for example, 20 ppm or more and 500 ppm or less, is preferably 50 ppm or more and 300 ppm or less, and is more preferably 100 ppm or more and 200 ppm or less), and act to suppress migration of the silver. However, the inventors of the present invention have newly found that the reflecting layer 29 of the silver plating which is produced by using such a sulfur-based gloss agent is likely to cause the migration of the silver, that is, grain-coarsening of the silver (coarsening of the silver crystal grains) due to the influence of water vapor in the atmosphere, whose mechanism is not sure though. Then, in order to solve this problem, the light-transmissive protective film 60 of the inorganic matter is formed on the reflecting layer 29 so as to prevent water vapor from reaching the reflecting layer 29. Thereby, the grain-coarsening of the silver can be suppressed, so that the high initial reflectivity of the reflecting layer 29, that is, the high light emitting efficiency of the light emitting device 100 can be maintained.

Incidentally, the glossiness of the reflecting layer 29 is, for example, 1.3 or more, and in the light of obtaining the high light emitting efficiency of the light emitting device 100, it is preferably 1.5 or more, and is more preferably 1.8 or more. On the other hand, an upper limit of the glossiness of the reflecting layer 29 is not limited particularly, and is a detection limit of a measurement apparatus, which is generally about 3.0. This glossiness is a scale that is generally used in the field of lead frames, which is measured, for example, with Densitmeter Model 144 produced by Gam Products, Inc., or a microscopic area color meter/reflectometer VSR 400 or a densitometer ND-11 produced by NIPPON DENSHOKU INDUSTRIES Co., LTD. Further, an average grain diameter of the silver in the reflecting layer 29 is preferably 5 nm or more and 500 nm or less, and is more preferably 5 nm or more and 100 nm or less. Herein, the average grain diameter can be defined by $D_{50}$, for example. Moreover, the average grain diameter can be measured by a laser diffraction and scattering method, an image analysis method (with a scanning electron microscope (SEM) or a transmission electron microscope (TEM)), a dynamic light scattering method, a small angle X-ray scattering method or the like. Among them, the image analysis method is preferable. The image analysis method conforms to JIS Z 8827-1:2008, for example. Furthermore, in the case where the main component of the reflecting layer 29 is the silver alloy, for example, the silver alloy is preferably silver-gold alloy. In addition, the "plating" is preferably electroplating, but includes electroless plating.

Hereinafter, an embodiment of the light emitting device 100 will be described.

As shown in FIGS. 1A and 1B, the light emitting elements 40 are provided on one of the pair of the lead electrodes 20 and 21 (on the first lead electrode 20 in the present embodiment). Then, it is preferable that the protective film 60 is provided both on the reflecting layer 29 and on the light emitting elements 40 continuously. Since the migration of the silver is promoted by energy of heat, light, electricity and the like, the grain-coarsening of the silver in the reflecting layer 29 is particularly likely to occur near the light emitting elements 40. Thus, by the continuous provision of the protective film 60 both on the reflecting layer 29 and on the light emitting elements 40, the grain-coarsening of the silver in the reflecting layer 29, that is, the lowering of the reflectance of the reflecting layer 29 can be suppressed effectively.

As shown in FIGS. 1A and 1B, a protective element 70 is provided on the other one of the pair of the lead electrodes 20 and 21 (on the second lead electrode 21 in the present embodiment). Then, it is preferable that the protective film 60 is provided both on the reflecting layer 29 and on the protective element 70 continuously. Due to the above-described reason, the grain-coarsening of the silver in the reflecting layer 29 is comparatively likely to occur also near the protective element 70. Therefore, by the continuous provision of the protective film 60 both on the reflecting layer 29 and on the protective element 70, the grain-coarsening of the silver in the reflecting layer 29, that is, the lowering of the reflectance of the reflecting layer 29 can be suppressed easily.

As shown in FIGS. 1A and 1B, the base member 10 is provided with the resin molded body 30 that is molded integrally with the pair of the lead electrodes 20 and 21. Then, it is preferable that the protective film 60 is provided both on the reflecting layer 29 and on the resin molded body 30 continuously. Water vapor in the atmosphere passes through fine gaps between the lead electrodes 20 and 21 and the resin molded body 30 and/or an inside of the resin molded body 30, and then reaches the bottom surface of the recess portion or an element-mounting surface of the base member 10. Therefore, by the continuous provision of the protective film 60 both on the reflecting layer 29 and on the resin molded body 30, the grain-coarsening of the silver in the reflecting layer 29, that is, the lowering of the reflectance of the reflecting layer 29 can be suppressed easily.

As shown in FIGS. 1A and 1B, each of the pair of the lead electrodes 20 and 21 have a base body 25 of copper or copper alloy, and further includes an intermediate layer 27 between the base body 25 and the reflecting layer 29. This intermediate layer 27 preferably includes at least a layer of nickel or nickel alloy. Thereby, copper in the base body 25 can be prevented from being diffused into the reflecting layer 29, so that the lowering of the reflectance of the reflecting layer 29 which is caused by the diffused copper and/or oxidation thereof can be suppressed. Further, the intermediate layer 27 may further include a layer of gold, palladium or alloy of them. Preferable examples of the intermediate layer 27 include: a single layer of nickel or nickel alloy; a laminate of a layer of nickel or nickel alloy and a layer of gold or gold alloy that are superimposed in this order; and a laminate of a layer of nickel or nickel alloy, a layer of palladium or palladium alloy and a layer of gold or gold alloy that are superimposed in this order.

The base material of the sealing member 50 is preferably silicone-based resin. The silicone-based resin has good light resistance and heat resistance, but permeates gas such as water vapor comparatively easily. Thus, the protective film 60 is particularly likely to achieve its effect. Incidentally, the silicone-based resin mainly denotes silicone resin, or its modified resin or hybrid resin.

Since calorific values of the light emitting elements 40 are increased according to increment of input electric power or light emitting output, the higher the input electric power is applied to drive the light emitting elements 40 or the higher their output is, the more likely the grain-coarsening of the silver in the reflecting layer 29 occurs. As an example of such a light emitting device, a luminous flux at a forward current of 65 mA is, for example, 25 lm or more, is preferably 30 lm or more, and is more preferably 35 lm or more. Further, a rated current is, for example, 120 mA or more, is preferably 150 mA or more, and is more preferably 180 mA or more. An average color rendering index Ra is preferably 80 or more. A special color rendering index R9 is preferably more than 0. Incidentally, these values are measured at a normal temperature (5° C. to 35° C.). Moreover, it is preferable that a base material of the resin molded body 30 is thermosetting resin, because deterioration of the resin molded body 30 due to light and heat can be suppressed, and even the light emitting device driven with high power or at high output can maintain the high light emitting efficiency easily.

As shown in FIG. 1A, a top-view shape (of an opening) of the recess portion of the base member 10 is a rectangle whose one of four corners is chamfered linearly. Since a space near the chamfered corner of the recess portion of the base member 10 is narrow, the light emitting efficiency of the light emitting device 100 can be enhanced easily by arranging the light emitting elements 40 away from this corner. Then, in this case, considering a region of the wire 80 for being connected with the protective element 70, the protective element 70 is preferably arranged most closely to a corner, which is diagonal to the chamfered corner in top view, among the four corners of the rectangle of the recess portion of the base member 10.

Hereinafter, the respective constituents of the light emitting device 100 of the embodiment of the present invention will be described.

Base Member 10

The base member 10 is a member to be a housing or a pedestal on which the light emitting elements 40 are mounted. The base member is mainly a package or a wiring board. As the base member 10, a flat-plate base member, a base member having a recess portion (a cup portion) or the like can be used. The recess portion may be formed by hollowing the resin molded body or a substrate base body itself, or may be an inside of a protrusion that is formed to have a frame shape separately on a substantially flat upper surface of the resin molded body or the substrate base body. As a top-view shape of the recess portion, a rectangle, a round-cornered rectangle, a circle, an ellipse and the like are exemplified. Among them, the top-view shape of the recess portion is preferably a rectangle or a round-cornered rectangle, which is substantially along an outer shape of the resin molded body, because outer shapes of many of the base members are rectangular in top view. Accordingly, the opening of the recess portion can be provided to be large, so that light emitted from the light emitting elements 40 can be extracted efficiently. Incidentally, regarding the top-view shape of the recess portion here, the linear chamfer for polarity identification (see a right upper part in FIG. 1A) is not considered. For releasing the resin molded body from a mold easily and extracting light of the light emitting elements 40 efficiently, a side wall surface of the recess portion is preferably inclined (or curved) so that an opening diameter of the recess portion may be increased from the bottom surface of the recess portion to its upward (an inclination angle thereof is, for example, 95° or more and 120° or less with respect to the bottom surface of the recess portion). A depth of the recess portion is not limited particularly, but is preferably 0.1 mm or more and 1 mm or less, and is more preferably 0.25 mm or more and 0.5 mm or less. In the case where the base member 10 is a wiring board, a material of the base body may be: a ceramic that contains aluminum oxide, aluminum nitride or mixture of them; resin such as epoxy resin, BT resin and polyimide resin; or their fiber-reinforced resin (reinforcing fibers are glass or the like).

Lead Electrodes 21 and 22

As the lead electrodes 21 and 22, a metal member that can conduct electrode when being connected to the light emitting element 40 can be used. Specific examples thereof include: copper; aluminum; gold; silver; palladium; chromium; titanium; tungsten; iron; nickel; cobalt; molybdenum; alloy of them; phosphor bronze; copper-iron alloy; and the like. Shapes of the lead electrodes 21 and 22 may be formed by treating the above-listed metal plate material (the base body) by pressing, rolling, etching or the like. Also, the lead electrodes 21 and 22 may be wirings of the wiring board. The lead electrodes 21 and 22 in this case can be produced by plating, sputtering, vapor deposition, printing, application, a cofiring method, a post-firing method or the like.

Resin Molded Body 30

As the base material of the resin molded body 30, thermosetting resin or thermoplastic resin can be used. Incidentally, below-described resin includes its modified resin and hybrid resin. As the thermosetting resin, epoxy resin, silicone resin, polybismaleimide triazine resin, polyimide resin, polyurethane resin, unsaturated polyester resin and the like are exemplified. Among them, any one of epoxy resin, silicone resin and unsaturated polyester resin is preferable. As the thermoplastic resin, aliphatic polyamide resin, semi-aromatic polyamide resin, aromatic polyphthalamide resin, polycyclohexylenedimethylene terephthalate, polyethylene terephthalate, polycyclohexane terephthalate, liquid crystal polymer, polycarbonate resin, syndiotactic polystyrene, polyphenylene ether, polyphenylene sulfide, polyether sulfone resin, polyether ketone resin, polyarylate resin and the like are exemplified. Among them, any one of aromatic polyphthalamide resin, aliphatic polyamide resin, polycyclohexane terephthalate and polycyclohexylenedimethylene terephthalate is preferable. Further, as a filler (including reinforcing fibers) or a coloring pigment, particles or fibers of glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, silicon carbide, antimony oxide, zinc stannate, zinc borate, iron oxide, chromium oxide, manganese oxide, carbon black or the like can be mixed into the base material. Among them, silica as the filler and titanium oxide or zinc oxide as the coloring pigment (a reflecting member) are preferably used. The resin molded body 30 can be molded by transfer molding or injection molding.

Light Emitting Element 40

As the light emitting element 40, a semiconductor light emitting element such as a light emitting diode element can be used. The light emitting element 40 may have an element structure that is composed of various semiconductors and a pair of positive and negative electrodes. In particular, a light emitting element of a nitride semiconductor that can emit ultraviolet light and visible light ($In_xAl_yGa_{1-x-y}N$, $0 \leq x$, $0 \leq y$, $x+y \leq 1$) is preferable. In the light of susceptibility of the grain-coarsening of the silver in the reflecting layer 29, a light emission peak wavelength of the light emitting element 40 is preferably 420 nm or more and 480 nm or less. Also, in the light of the light emitting efficiency, the excitation efficiency of the phosphor, the color mixing relation with light of the phosphor, and the like, the light emission peak wavelength is particularly preferably 445 nm or more and 465 nm or less. Other than this, a light emitting element of a gallium arsenide-based or gallium phosphide-based semiconductor that emits green to red light may be used. Many of the light emitting elements have substrates. The substrate is preferably light-transmissive, but is not limited to this. As the base material of the substrate, sapphire, spinel, gallium nitride, aluminum nitride, silicon, silicon carbide, gallium arsenide, gallium phosphide, indium phosphide, zinc sulfide, zinc oxide, zinc selenide and the like are exemplified. In the case of the light emitting element in which the pair of the positive and negative electrodes are provided on the same surface, each of the electrodes is connected to the lead electrode via the wire so as to be mounted in a face-up manner. Also, each of the electrodes may be connected to the lead electrode by an electrically conductive adhesive so as to be mounted in a face-down (flip-chip) manner. In the case of the light emitting element having a counter electrode structure in which the pair of the positive and negative electrodes are provided respectively on opposite surfaces, the lower surface electrode adheres to the lead electrode with an electrically conductive adhesive, and the upper surface electrode adheres to the lead electrode with a wire. The number of the light emitting elements to be mounted on the one base member may be one or more. The plurality of the light emitting elements may be connected in series or in parallel via the wires or the lead electrodes. Further, for example, three light emitting elements that respectively emit light in blue, green, and red may be mounted on the one base member such as a package.

Sealing Member 50

The sealing member 50 is a member for sealing the light emitting elements 40, the protective element 70, the wires 80 and the like so as to protect them from outside air, external force, and the like. The base material of the sealing member 50 may have an electrical insulation property, and can transmit light that is emitted from the light emitting elements 40 and/or the phosphor 90 (preferably at transmittance of 70% or more). Specific examples thereof include: silicone resin; epoxy resin; phenol resin; polycarbonate resin; acrylic resin; polymethylpentene resin (TPX (registered trademark)); polynorbornene resin; and their modified resin and hybrid resin. Further, the base material of the sealing member 50 may contain particles having various functions such as a filler and a phosphor to be mixed therein. As the filler, silica, glass, zinc oxide, aluminum oxide, zirconium oxide, titanium oxide, carbon black and the like are exemplified.

Protective Film 60

The protective film 60 is preferably made of oxide, nitride or oxynitride of at least one element selected from the group consisting of: silicon; aluminum; zirconium; titanium; zinc; magnesium; tantalum; niobium; yttrium; indium; tin; and hafnium. Among them, oxide, nitride or oxynitride of at least one element selected from the group consisting of: silicon; aluminum; and zirconium, which have relatively low water vapor permeability, is particularly preferable. As the protective film 60, a single layer film is favorable because of its easiness, but a multilayer film can further lower its water vapor permeability. The water vapor permeability of the protective film 60 is not limited particularly, but is preferably 15 g/m²/day or less, and is more preferably 5 g/m²/day or less. Incidentally, measurement of this water vapor permeability conforms to JIS K7129. A film thickness of the protective film 60 is not limited particularly, but in the light of the water vapor permeability and the light-transmittance, it is preferably 1 nm or more and 1000 nm or less, and is more preferably 5 nm or more and 100 nm or less. The protective film 60 can be formed by at least one of: a sputtering method; a vapor deposition method; and an atomic layer deposition method (an ALD method). Among them, the sputtering method is preferable because of its easiness, and the atomic layer deposition method is also preferable because it can easily form a fine film with low water vapor permeability.

Protective Element 70

The protective element 70 is an element for protecting the light emitting elements 40 from static electricity and a high-voltage surge. Specific examples thereof include a Zener diode.

Wire 80

The wires 80 are conducting wires that connect electrodes of the light emitting elements 40 with the lead electrodes 20 and 21. Further, the wires 80 can also be used for connecting an electrode of the protective element 70 with the lead electrode. More specifically, metal wires of: gold; copper; silver; platinum; aluminum; palladium; or alloy of them can be used. Among them, gold wires, which are hardly broken due to stress from the sealing member and have good thermal resistance and the like, are particularly preferable. Also, at least a surface of the wire 80 may be made of silver in order to enhance its light reflecting property.

Adhesive 85

The adhesive 85 is a member that allows the light emitting elements 40 to adhere to the lead electrode. As an electrically insulative adhesive, epoxy resin, silicone resin, polyimide resin, their modified resin or hybrid resin, or the like can be used. As an electrically conductive adhesive, electrically conductive paste of silver, gold, palladium or the like, tin-bismuth based, tin-copper based, tin-silver based or gold-tin based solder or the like can be used.

Phosphor 90

The phosphor 90 absorbs at least a part of primary light that is emitted from the light emitting elements 40, and emits secondary light whose wavelength is different from that of the primary light. Specific examples thereof include: yttrium-aluminum-garnet activated with cerium; lutetium-aluminum-garnet activated with cerium; nitrogen-containing calcium aluminosilicate (some of the calcium atoms can be substituted with strontium atoms) activated with europium and/or chromium; sialon activated with europium; silicate activated with europium; strontium aluminate activated with europium; potassium fluorosilicate activated with manganese; and the like. By these phosphors, the light emitting device 100 can emit mixed-color light (for example, white light) of primary light and secondary light at visible wavelengths, or can be excited with ultraviolet primary light so as to emit secondary light at a visible wavelength.

As described above, the top-view (top face) light emitting device has been described as one embodiment, but a side-view (side face) light emitting device may also be adopted, and a structure of an external connection terminal of the light emitting device is not limited particularly.

EXAMPLES

Hereinafter, examples according to the present invention will be described in detail. Incidentally, needless to say, the present invention is not limited only to the below-stated examples.

Example 1

A light emitting device of Example 1 is a substantially rectangular parallelopiped top-view SMD-type LED, which has a configuration of the light emitting device 100 shown in FIGS. 1A and 1B.

A base member has a size of: a length of 3.0 mm; a width of 3.0 mm; and a thickness of 0.65 mm, which has a structure that a resin-molded body is molded integrally with a pair of positive and negative (first and second) lead electrodes. This base member is produced by: setting a processing metal board (a lead frame), which includes plural sets of the lead electrodes arranged consecutively in rows and columns via suspension leads, into a mold; injecting a liquid constituent material of the resin-molded body into the mold; curing and releasing the constituent material; and subsequently cutting (individualizing) them. Incidentally, in the present example, the cutting of the base member is carried out after a process of sealing light emitting elements.

Each of the first and second lead electrodes is a board-shaped small piece with a maximum thickness of 0.2 mm, which is provided with: a base body of copper alloy; an intermediate layer including nickel (with a minimum thickness of 2 μm), palladium (with a minimum thickness of 15 nm) and gold (with a minimum thickness of 3 nm) that are laminated in this order on the base body; and a reflecting layer (with a minimum thickness of 2 μm) whose main component is silver, as a surface layer. The intermediate layer and the reflecting layer are produced by electroplating. The reflecting layer is produced by using a sulfur-based gloss agent, and contains about 100 ppm to about 200 ppm of sulfur. The sulfur-based gloss agent is a carbon disulfide derivative. Exposed regions of lower surfaces of the first and second lead electrodes are substantially the same as a lower surface of the resin molded body, and constitutes a lower surface of the base member. On end surfaces of the base member (the resin-molded body), cut portions of the suspension leads are exposed from the first and second lead electrodes, respectively.

An outer shape of the resin molded body is a regular square with a length of 3.0 mm and a width of 3.0 mm in top view, and has a maximum thickness of 0.65 mm, which is made of epoxy resin containing silica and titanium oxide. At a substantial center of an upper surface of the resin molded body, that is, an upper surface of the base member, a recess portion with a depth of 0.45 mm, which has a round-cornered regular square opening with a length of 2.6 mm and a width of 2.6 mm (excluding a linear chamfer for polarity identification) in top view, is formed. An inclination angle of a side wall surface of the recess portion is 117° with respect to a bottom surface of the recess portion.

On the bottom surface of the recess portion of the base member, the two light emitting elements adhere onto the first lead electrode with an adhesive of dimethyl silicone resin. Each of these light emitting elements is an LED chip with a size of: a length of 650 μm; a width of 650 μm; and a thickness of 200 μm, in which an element structure of a nitride-based semiconductor is laminated on a sapphire substrate, and which is able to emit blue light (at a center wavelength of about 453 nm). Further, an n electrode of the light emitting element is connected to the upper surface of the first lead electrode via a wire, and a p electrode of the light emitting element is connected to the upper surface of the second lead electrode via a wire. The wires are gold wires with a wire diameter of 18 μm. Moreover, a protective element that is a Zener diode having a counter electrode structure with a length of 150 μm, a width of 150 μm, and a thickness of 85 μm adheres onto the second lead electrode with an electrically conductive adhesive that is silver paste. An upper surface electrode of the protective element is connected to the upper surface of the first lead electrode via a wire. Incidentally, the protective element is arranged most closely to a corner, which is diagonal to a chamfered corner in top view, among the four corners of the rectangle of the recess portion of the base member.

A sealing member is filled in the recess portion of the base member so as to coat the light emitting elements and the protective element. A base material of the sealing member is phenyl silicone resin which contains: a filler of silica (with an average grain diameter of 6 μm) and zirconium oxide (with an average grain diameter of 5 nm); and phosphors of LAG, YAG, SAE and SCASN. An upper surface of the sealing member is substantially the same as the upper surface of the base member, and constitutes a substantially flat surface (strictly, a slightly recessed surface due to its cure shrinkage). This sealing member is produced by: dispensing a liquid constituent material into the recess portion of the base member with a dispenser or the like; and curing the constituent material by heat.

Between the reflecting layers of the first and second lead electrodes and the sealing member, a protective film of silicon oxide with a thickness of about 20 nm to about 40 nm is formed. This protective film is formed from the upper surface of the base member by a sputtering method, after mounting the light emitting elements and the protective element on the base member. Thus, the protective film is provided over a whole area of the upper surface of the base member including an inside of the recess portion. In more detail, the protective film is provided on the reflecting layers of the first and second lead electrodes, on the light emitting elements, on the protective element and on the resin molded body continuously. Further, the protective film contacts the reflecting layers of the lead electrodes, the light emitting elements, the protective element, and the resin molded body.

Comparative Example 1

A light emitting device of Comparative Example 1 is manufactured similarly to the light emitting device of Example 1 except that reflecting layers of first and second lead electrodes are produced by using a selenium-based gloss agent.

Evaluation 1

The light emitting device of Example 1 can emit light with an initial luminous flux ($\Phi_v$) of 35.3 lm (light emitting efficiency of 197 lm/W) at a forward current of 65 mA and forward voltage of 2.75 V. This value of the initial luminous flux is higher than that of Comparative Example 1 by 0.9%.

Comparative Example 2

A light emitting device of Comparative Example 2 is manufactured similarly to the light emitting device of Example 1 except that no protective film is provided.

Evaluation 2

The light emitting devices of Example 1 and Comparative Example 2 are subjected to life tests under a high-temperature and high-humidity environment (at a temperature of 85° C., humidity of 85% RH and a forward current of 150 mA), and then, the light emitting device of Comparative Example 2 exhibits conspicuous discoloration (yellowing) of a reflecting layer due to grain-coarsening of silver and a significant decrease of a luminous flux, for example, after 500 hours passes from the test. Incidentally, the discoloration of the reflecting layer is particularly conspicuous near light emitting elements which are heat sources and light emitting sources. On the other hand, in the light emitting device of Example 1, such discoloration of the reflecting layer is hardly observed, and the initial luminous flux can be maintained at the high rate.

Example 2

A light emitting device of Example 2 is manufactured similarly to the light emitting device of Example 1 except that only one light emitting element is provided.

Example 3

A light emitting device of Example 3 is manufactured similarly to the light emitting device of Example 2 except that a sealing member contains no phosphor.

Comparative Example 3

A light emitting device of Comparative Example 3 is manufactured similarly to the light emitting device of Comparative Example 2 except that only one light emitting element is provided.

Comparative Example 4

A light emitting device of Comparative Example 4 is manufactured similarly to the light emitting device of Comparative Example 3 except that a sealing member contains no phosphor.
Evaluation 3

Figure 2A:
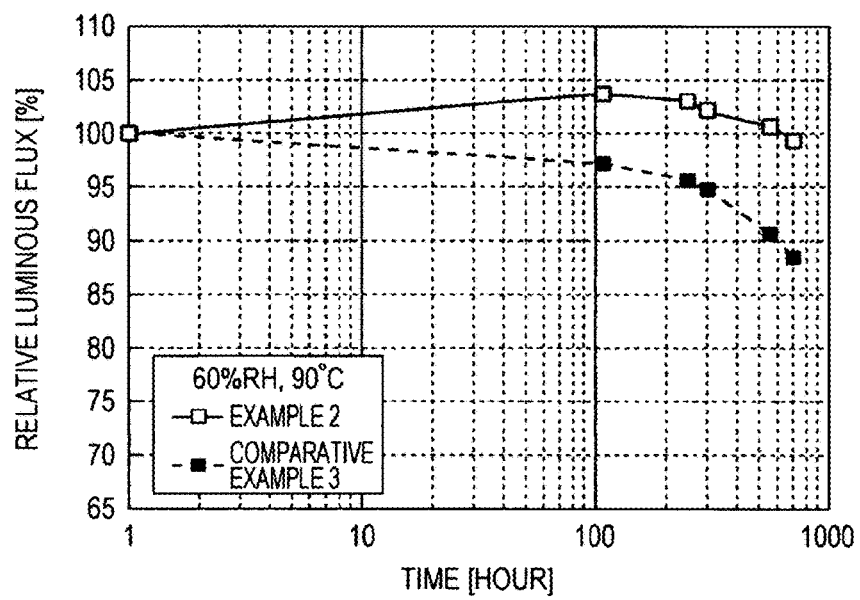
FIG. 2A is a graph showing results of life tests which are performed with respect to the light emitting devices according to one example of the present invention and one comparative example under a high-temperature and high-humidity environment.
Figure 2B:
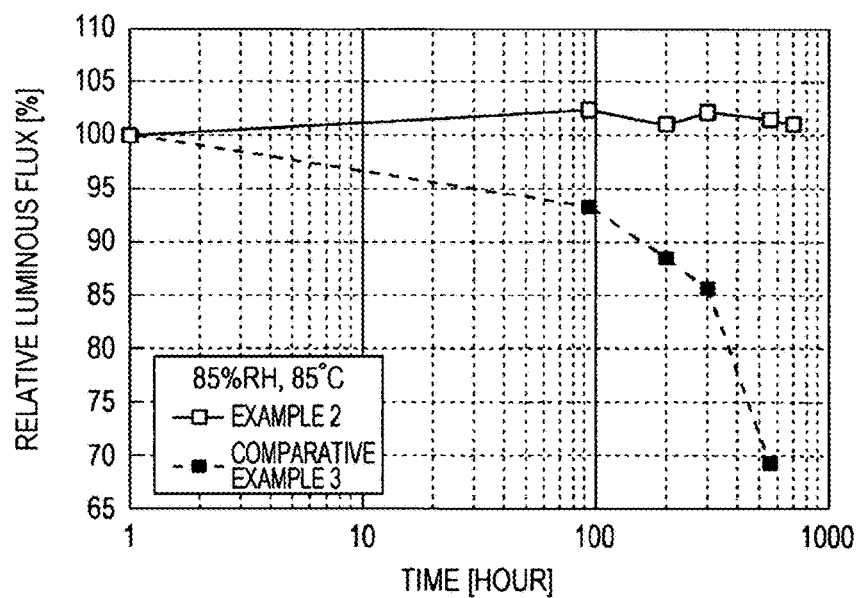
FIG. 2B is a graph showing results of life tests which are performed with respect to the light emitting devices according to one example of the present invention and one comparative example under a high-temperature and high-humidity environment.
Figure 3A:
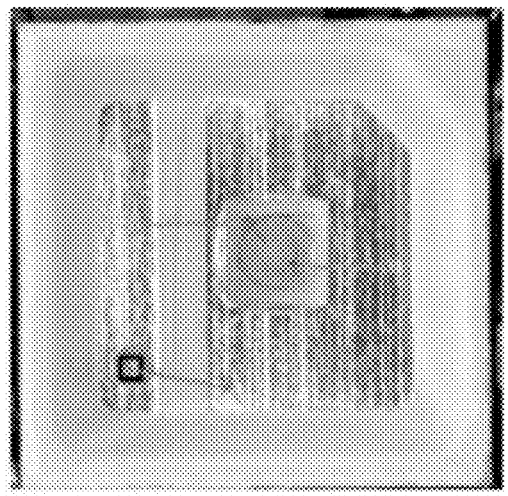
FIG. 3A is a photo of an outer appearance of the light emitting device according to one example of the present invention after 500 hours from the life test which is performed under the high-temperature and high-humidity environment.
Figure 3B:
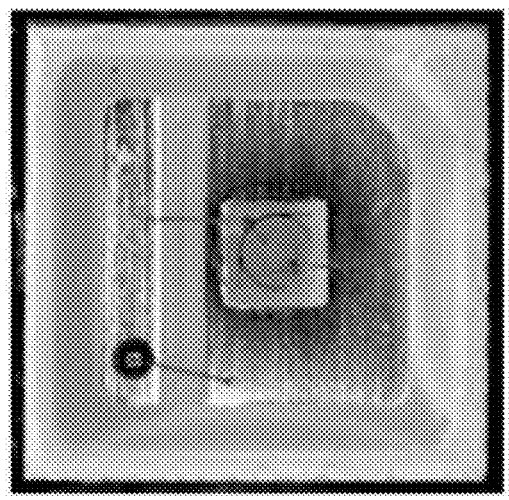
FIG. 3B is a photo of an outer appearance of the light emitting device according to one comparative example after 500 hours from the life test which is performed under the high-temperature and high-humidity environment.

The light emitting devices of Examples 2 and 3 and Comparative Examples 3 and 4 are subjected to life tests under high-temperature and high-humidity environments: at a temperature of 90° C., humidity of 60% RH and a forward current of 150 mA in Test Condition 1; and at a temperature of 85° C., humidity of 85% RH and a forward current of 150 mA in Test Condition 2. FIGS. 2A and 2B are respectively graphs showing results of the tests which are performed under Test Conditions 1 and 2 (Example 2 and Comparative Example 3), respectively. FIGS. 3A and 3B are photos of outer appearances of the light emitting devices of Example 3 and Comparative Example 4 after 500 hours from the life tests that are performed under Test Condition 2. As shown in FIGS. 2A and 2B, the light emitting device of Example 2 maintains its initial luminous flux at a high rate, but a luminous flux of the light emitting device of Comparative Example 3 is decreased significantly. Also, it can be found that, from the significant decrease of the luminous flux of the light emitting device of Comparative Example 3 under the condition of the higher humidity, the discoloration of the reflecting layer is affected largely by water vapor in the atmosphere. Further, as shown in FIGS. 3A and 3B, the discoloration (the yellowing) of the reflecting layer, which is a main cause of the decrease of the luminous flux, is observed conspicuously near the light emitting element in the light emitting device of Comparative Example 4, but on the other hand, such discoloration is hardly observed in the light emitting device of Example 3.

The inventors of the present invention have newly found that, if using a sulfur-based gloss agent for silver plating, high initial reflectivity can be obtained, but the silver is likely to be grain-coarsened due to the influence of water vapor in the atmosphere, whereby the reflectivity of the silver film is likely to deteriorate over a course of time.

The light emitting device according to one embodiment of the present invention includes: a base member that has a pair of lead electrodes; a light emitting element that is provided on the base member, and is connected electrically with the pair of the lead electrodes; and a sealing member that is provided on the base member, seals the light emitting element and at least a part of the pair of the lead electrodes, and contains resin as a base material, wherein the pair of the lead electrodes each have, as their surface layers, a reflecting layer of silver or silver alloy plating which use (contain) a sulfur-based gloss agent, and a light-transmissive protective film that is made of an inorganic matter is formed between the reflecting layer and the sealing member.

By the light emitting device according to one embodiment of the present invention, high initial reflectivity of the reflecting layer can be obtained, and its deterioration with time can be suppressed, whereby good light emitting efficiency can be obtained.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
   a base having a first lead electrode and a second lead electrode, each of the first lead electrode and the second lead electrode having a first surface and including a reflecting layer on the first surface, the reflecting layer comprising silver or silver alloy plating containing a sulfur-based gloss agent, the base having a resin molded body that is molded integrally with the first lead electrode and the second lead electrode to provide a concave shape comprising:
      a top surface having an opening;
      a recess bottom surface opposite to the opening in a height direction of the base;
      an inner side surface connecting the top surface and the recess bottom surface; and
      an outer side surface connected to the top surface opposite to the inner side surface in a lateral direction perpendicular to the height direction;
   a light emitting element which is provided on one side of the base and on the first surface of the first lead electrode and which is electrically connected to the first lead electrode and the second lead electrode, the reflecting layer being on the one side of the base, the light emitting element and the reflecting layer being provided on the recess bottom surface;
   a sealer comprising resin and provided on the one side of the base to seal the light emitting element and at least a part of the first lead electrode and the second lead electrode; and
   a light-transmissive protective film comprising an inorganic matter and provided between the reflecting layer and the sealer and on both of the reflecting layer and the light emitting element continuously, the light-transmissive protective film having a bottom film portion and a top film portion, the bottom film portion being provided on the both of the reflecting layer and the light emitting element, the top film portion being provided on the top surface, the light-transmissive protective film extending from the bottom film portion to the top film portion on the inner side surface, the light-transmissive protective film uncovering the outer side surface.

2. The light emitting device according to claim 1, further comprising:

a protective element provided on the first lead electrode or the second lead electrode, wherein the light-transmissive protective film is provided both on the reflecting layer and on the protective element continuously.

3. The light emitting device according to claim 1, wherein the base has a resin molded body that is molded integrally with the first lead electrode and the second lead electrode, and a base material of the resin molded body comprises thermosetting resin.

4. The light emitting device according to claim 1, wherein water vapor permeability of the light-transmissive protective film is 15 g/m$^2$/day or less.

5. The light emitting device according to claim 1, wherein a film thickness of the light-transmissive protective film is 1 nm or more and 1000 nm or less.

6. The light emitting device according to claim 1, wherein the light-transmissive protective film comprises oxide, nitride, or oxynitride of at least one element of silicon, aluminum, zirconium, titan, zinc, magnesium, tantalum, niobium, yttrium, indium, tin, and hafnium.

7. The light emitting device according to claim 6, wherein a film thickness of the light-transmissive protective film is 1 nm or more and 1000 nm or less.

8. The light emitting device according to claim 7, wherein the base has a resin molded body that is molded integrally with the first lead electrode and the second lead electrode.

9. The light emitting device according to claim 8, wherein a base material of the resin molded body comprises thermosetting resin.

10. The light emitting device according to claim 9, wherein a base material of the sealer comprises silicone-based resin.

11. The light emitting device according to claim 10, wherein the reflecting layer contains 50 ppm or more and 300 ppm or less of sulfur.

12. The light emitting device according to claim 11, further comprising:

a protective element provided on the first lead electrode, wherein the base has a recess portion, and a part of a recess bottom surface of the recess portion is constituted by an upper surface of the first lead electrode and an upper surface of the second lead electrode, a top-view shape of the recess portion of the base is a rectangle whose one of four corners is chamfered linearly, and the protective element is arranged most closely to a corner, which is diagonal to a chamfered corner in top view, among the four corners of the rectangle of the recess portion of the base.

13. The light emitting device according to claim 12, wherein the light emitting element is provided on the first lead electrode, and the light-transmissive protective film is provided both on the reflecting layer and on the light emitting element continuously.

14. The light emitting device according to claim 13, wherein the light-transmissive protective film is provided both on the reflecting layer and on the protective element continuously.

15. The light emitting device according to claim 14, wherein a glossiness of the reflecting layer which is measured is 1.3 or more.

16. The light emitting device according to claim 1, wherein a base material of the sealer comprises silicone-based resin.

17. The light emitting device according to claim 1, wherein the first lead electrode and the second lead electrode have a base body comprising copper or copper alloy, and further include a layer comprising nickel or nickel alloy between the base body and the reflecting layer.

18. The light emitting device according to claim 1, wherein the reflecting layer contains 50 ppm or more and 300 ppm or less of sulfur.

19. The light emitting device according to claim 1, further comprising:

a protective element provided on the first lead electrode, wherein the base has a recess portion, and a part of a recess bottom surface of the recess portion is constituted by an upper surface of the first lead electrode and an upper surface of the second lead electrode, a top-view shape of the recess portion of the base is a rectangle whose one of four corners is chamfered linearly, and the protective element is arranged most closely to a corner, which is diagonal to a chamfered corner in top view, among the four corners of the rectangle of the recess portion of the base.

20. The light emitting device according to claim 1, wherein a glossiness of the reflecting layer which is measured is 1.3 or more.

21. A light emitting device comprising:

a base having a first lead electrode and a second lead electrode, each of the first lead electrode and the second lead electrode having a first surface and including a reflecting layer on the first surface, the reflecting layer comprising silver or silver alloy plating containing a sulfur-based gloss agent, the base having a recess portion, a part of a recess bottom surface of the recess portion being constituted by an upper surface of the first lead electrode and an upper surface of the second lead electrode, a top-view shape of the recess portion of the base being a rectangle whose one of four corners is chamfered linearly;

a light emitting element which is provided on one side of the base and on the first surface of the first lead electrode and which is electrically connected to the first lead electrode and the second lead electrode, the reflecting layer being on the one side of the base;

a protective element provided on the first lead electrode, the protective element being arranged most closely to a corner, which is diagonal to a chamfered corner in top view, among the four corners of the rectangle of the recess portion of the base;

a sealer comprising resin and provided on the one side of the base to seal the light emitting element and at least a part of the first lead electrode and the second lead electrode; and a light-transmissive protective film comprising an inorganic matter and provided between the reflecting layer and the sealer and on both of the reflecting layer and the light emitting element continuously.

* * * * *